(12) United States Patent
Zhang et al.

(10) Patent No.: US 8,369,448 B2
(45) Date of Patent: Feb. 5, 2013

(54) BIT MAPPING SCHEME FOR AN LDPC CODED 32APSK SYSTEM

(75) Inventors: Juntan Zhang, North Potomac, MD (US); Jilong Li, Beijing (CN); Fengwen Sun, Germantown, MD (US)

(73) Assignee: Availink, Inc., Germantown, MD (US)

( * ) Notice: Subject to any disclaimer, the term of this patent is extended or adjusted under 35 U.S.C. 154(b) by 278 days.

(21) Appl. No.: 11/813,208

(22) PCT Filed: Sep. 18, 2006
(Under 37 CFR 1.47)

(86) PCT No.: PCT/CN2006/002424
§ 371 (c)(1),
(2), (4) Date: May 28, 2010

(87) PCT Pub. No.: WO2008/034289
PCT Pub. Date: Mar. 27, 2008

(65) Prior Publication Data
US 2011/0164705 A1    Jul. 7, 2011

(51) Int. Cl.
*H04L 27/36* (2006.01)
*H04L 27/38* (2006.01)
(52) U.S. Cl. ........................ 375/298; 375/324
(58) Field of Classification Search .............. 375/269, 375/279, 300, 295, 298, 316, 324
See application file for complete search history.

(56) References Cited

U.S. PATENT DOCUMENTS

| | | |
|---|---|---|
| 5,946,047 A | 8/1999 | Levan |
| 6,154,871 A | 11/2000 | Claydon et al. |
| 6,320,917 B1 | 11/2001 | Stott et al. |
| 6,421,387 B1 | 7/2002 | Rhee |
| 6,522,635 B1 | 2/2003 | Bedwell |
| 6,757,122 B1 | 6/2004 | Kuznetsov et al. |
| 6,963,622 B2 | 11/2005 | Eroz et al. |
| 6,973,140 B2 | 12/2005 | Hoffman et al. |
| 7,065,703 B2 | 6/2006 | Krieger |
| 7,237,173 B2 * | 6/2007 | Morita et al. ............ 714/755 |
| 7,281,192 B2 | 10/2007 | Shen et al. |

(Continued)

FOREIGN PATENT DOCUMENTS

| | | |
|---|---|---|
| DE | 10134764 | 1/2003 |
| JP | 2000078116 | 3/2000 |

(Continued)

OTHER PUBLICATIONS

European Telecommunications Standards Institute, "Digital Video Broadcasting (DVB); Second generation framing structure, channel coding and modulation systems for Broadcasting, Interactive Services, News Gathering and other broadband satellite applications," European Broadcasting Union, ETSI EN 302 307 v1.1.2, , Sophia-Antipo Cedex, Fr, Jun. 2006.

(Continued)

*Primary Examiner* — Khanh C Tran
*Assistant Examiner* — David Huang
(74) *Attorney, Agent, or Firm* — Greenblum & Bernstein, P.L.C.

(57) ABSTRACT

A digital communication system, having a transmitter to transmit a digital signal; and a receiver to receive the digital signal; wherein the digital signal utilizes a 32APSK system with FEC coding, and the signal is bit-mapped using gray mapping, and bits of the digital signal are ordered based on the values of a log likelihood ratio from a communications channel.

9 Claims, 6 Drawing Sheets

U.S. PATENT DOCUMENTS

| | | | |
|---|---|---|---|
| 7,343,539 | B2 | 3/2008 | Divsalar et al. |
| 7,584,400 | B2 | 9/2009 | Gray et al. |
| 7,936,707 | B2 | 5/2011 | Kota et al. |
| 2003/0039322 | A1 | 2/2003 | Murakami et al. |
| 2003/0223507 | A1 | 12/2003 | De Gaudenzi et al. |
| 2004/0086059 | A1 | 5/2004 | Eroz et al. |
| 2004/4221223 | | 11/2004 | Yu et al. |
| 2005/0058229 | A1 | 3/2005 | Alagha |
| 2005/0066262 | A1 | 3/2005 | Eroz et al. |
| 2005/0089068 | A1 | 4/2005 | Sun et al. |
| 2005/0123073 | A1 | 6/2005 | Ginesi et al. |
| 2005/0138519 | A1 | 6/2005 | Boutillon et al. |
| 2005/0180534 | A1 | 8/2005 | Brotje et al. |
| 2005/0229090 | A1 | 10/2005 | Shen et al. |
| 2005/0271160 | A1 | 12/2005 | Eroz et al. |
| 2006/0013333 | A1 | 1/2006 | Chen |
| 2006/0015791 | A1 | 1/2006 | Kikuchi et al. |
| 2006/0072684 | A1 | 4/2006 | Feher |
| 2006/0085720 | A1 | 4/2006 | Tran et al. |
| 2006/0115027 | A1 | 6/2006 | Srebranig |
| 2006/0156169 | A1 | 7/2006 | Cameron et al. |
| 2006/0156199 | A1 | 7/2006 | Palanki et al. |
| 2006/0206779 | A1 | 9/2006 | Wehn et al. |
| 2006/0276125 | A1 | 12/2006 | Dibiaso et al. |
| 2006/0282742 | A1* | 12/2006 | Zhang et al. ............... 714/758 |
| 2007/0022362 | A1 | 1/2007 | Yue et al. |
| 2007/0113147 | A1 | 5/2007 | Hong et al. |
| 2007/0118787 | A1* | 5/2007 | Schmidt ...................... 714/752 |
| 2007/0162815 | A1 | 7/2007 | El-Khamy et al. |
| 2007/0186138 | A1 | 8/2007 | Yang et al. |
| 2008/0104474 | A1* | 5/2008 | Gao et al. ................... 714/752 |

FOREIGN PATENT DOCUMENTS

| | | |
|---|---|---|
| JP | 60206284 | 10/2005 |
| KR | 2002001039 | 1/2002 |

OTHER PUBLICATIONS

Morello A. and Mignone V, "DVB-S2—ready for lift off," EBU Technical Review, No. 300, pp. 1-10, Oct. 2004.

Eroz M et al, "DVB-S2 Low Density Parity Check Codes With Near Shannon Limit Performance," International Journal of Satellite Communications and Networking, vol. 22, pp. 269-279, Jun. 2004.

De Gaudenzi R, et al., "Performance Analysis of Turbo-Coded APSK Modulations Over Nonlinear Satellite Channels," IEEE Transactions of Wireless Communications, vol. 5, No. 9, Sep. 2006.

Benedetto S. et al., "MHOMS: High-Speed ACM Modem for Satellite Applications," IEEE Wireless Communications, Apr. 2005.

"Near optimum universal belief propagation based decoding of low-density parity check codes", source(s): Jinghu Chen; Fossorier, M.P. C.; Communications, IEEE Transactions on vol. 50, Issue 3, Mar. 2002 pp. 406-414 Digital Object Identifier 10.1109/26.990903.

"A variable-rate QPSK demodulator for digital satellite TV reception", source(s): Karam, G. (Soc. Anonyme de Telecommun., France); Paxal, C.; Sari, H. Source: IBC 94. International Broadcasting Convention (Conf. Publ. No. 397), 1994, p. 646-50.

"DVB-S2, the second generation standard for satellite broadcasting and unicasting", source(s): Morello, A. (Development Centre RAI, Italy); Reimers, U. Source: International Journal of Satellite Communications and Networking, v 22, n 3, May-Jun. 2004, p. 249-68.

"COMETS 21-GHz advanced satellite broadcasting experiments-evaluation of trellis-coded 8-PSK performance", source(s): Ohkawa, M.; Takahashi, T.; Huan-Bang Li; Iigusa, K.; Wakana, H.; Broadcasting, IEEE Transactions on vol. 46, Issue 2, Jun. 2000 pp. 144-151 Digital Object Identifier 10.1109/11.868930.

"Encapsulation and framing efficiency of DVB-S2 satellite systems", source(s): Castro, M.A.V.; Cardoso, A.; Rinaldo, R.; Vehicular Technology Conference, 2004. VTC 2004-Spring. 2004 IEEE 59th vol. 5, May 17-19, 2004 pp. 2896-2900 vol. 5 Digital Object Identifier 10.1109NETEC S .2004.1391454.

"COMETS 21-GHz advanced satellite broadcasting experiments-evaluation of trellis-coded 8-PSK performance", source(s): Ohkawa, M.; Takahashi, T.; Huan-Bang Li; Iigusa, K.; Wakana, H.; Broadcasting, IEEE Transactions on vol. 46, Issue 2, Jun. 2000 pp. 144-151 Digital Object Identifier 10.1109/11.868930.

"Encapsulation and framing efficiency of DVB-S2 satellite systems", source(s): Castro, M.A.V.; Cardoso, A.; Rinaldo, R.; Vehicular Technology Conference, 2004. VTC 2004-Spring. 2004 IEEE 59th vol. 5, May 17-19, 2004 p. 2896-2900 vol. 5 Digital Object Identifier 10.1109NETEC S.2004.1391454.

"Transmission system for satellite ISDB", source(s): Saito, T.; Hashimoto, A.; Minematsu, F.; Katoh, H.; Matsumura, H.; Global Telecommunications Conference, 1998. GLOBECOM 98. The Bridge to Global Integration. IEEE vol. 5, Nov. 8-12, 1998 pp. 2942-2947 vol. 5 Digital Object Identifier 10.1109/GLOCOM.1998. 776613.

International Search Report and the Written Opinion, mailed Jun. 14, 2007, cited in related International Patent Application No. PCT/CN2006/002423, filed Sep. 18, 2006.

Yan Li et al., "Bit-Reliability Mapping in LDPC-Coded Modulation Systems", IEEE Communications Letters 9(1):13 , Jan. 2005.

Morello A. et al., "DVB-S2: The Second Generation Standard for Satellite Broad-band Services ", Proceedings of the IEEE, 94(1), Jan. 2006, pp. 210-227.

* cited by examiner

Figure 1

$$H = \begin{bmatrix} 0 & 1 & 0 & 1 & 0 & 0 \\ 1 & 1 & 0 & 0 & 0 & 0 \\ 1 & 0 & 0 & 0 & 1 & 1 \\ 0 & 0 & 1 & 0 & 0 & 1 \end{bmatrix}$$

BIT MAPPING SCHEME FOR AN LDPC CODED 32APSK SYSTEM

RELATED APPLICATIONS

This application relates to application Ser. No. 12/717,815, titled "A Bit Mapping Scheme for an LDPC Coded 16APSK System" filed on Mar. 4, 2010, and application Ser. No. 12/710,276 titled "An Interleaving Scheme for an LDPC Coded 32APSK System" filed on Feb. 22, 2010.

FIELD OF THE INVENTION

The invention relates to digital communications and in particular to a bit mapping scheme for an LDPC coded 32APSK System.

BACKGROUND OF THE INVENTION

Forward Error Control (FEC) coding is used by communications systems to ensure reliable transmission of data across noisy communication channels. Based on Shannon's theory, these communication channels exhibit a fixed capacity that can be expressed in terms of bits per symbol at a given Signal to Noise Ratio (SNR), which is defined as the Shannon limit. One of the research areas in communication and coding theory involves devising coding schemes offering performance approaching the Shannon limit while maintaining a reasonable complexity. It has been shown that LDPC codes using Belief Propagation (BP) decoding provide performance close to the Shannon limit with tractable encoding and decoding complexity.

In a recent paper Yan Li and William Ryan, "Bit-Reliability Mapping in LDPC-Codes Modulation systems", IEEE Communications Letters, vol. 9, no. 1, January 2005, the authors studied the performance of LDPC-coded modulation systems with 8PSK. With the authors' proposed bit reliability mapping strategy, about 0.15 dB performance improvement over the non-interleaving scheme is achieved. Also the authors show that gray mapping is more suitable for high order modulation than other mapping scheme such as natural mapping.

BRIEF SUMMARY OF THE INVENTION

Various embodiments of the present invention are directed to a bit mapping scheme in a 32APSK modulation system. The techniques of these embodiments are particularly well suited for use with LDPC codes.

LDPC codes were first described by Gallager in the 1960s. LDPC codes perform remarkably close to the Shannon limit. A binary (N, K) LDPC code, with a code length N and dimension K, is defined by a parity check matrix H of (N-K) rows and N columns. Most entries of the matrix H are zeros and only a small number the entries are ones, hence the matrix H is sparse. Each row of the matrix H represents a check sum, and each column represents a variable, e.g., a bit or symbol. The LDPC codes described by Gallager are regular, i.e., the parity check matrix H has constant-weight rows and columns.

Figure 1:
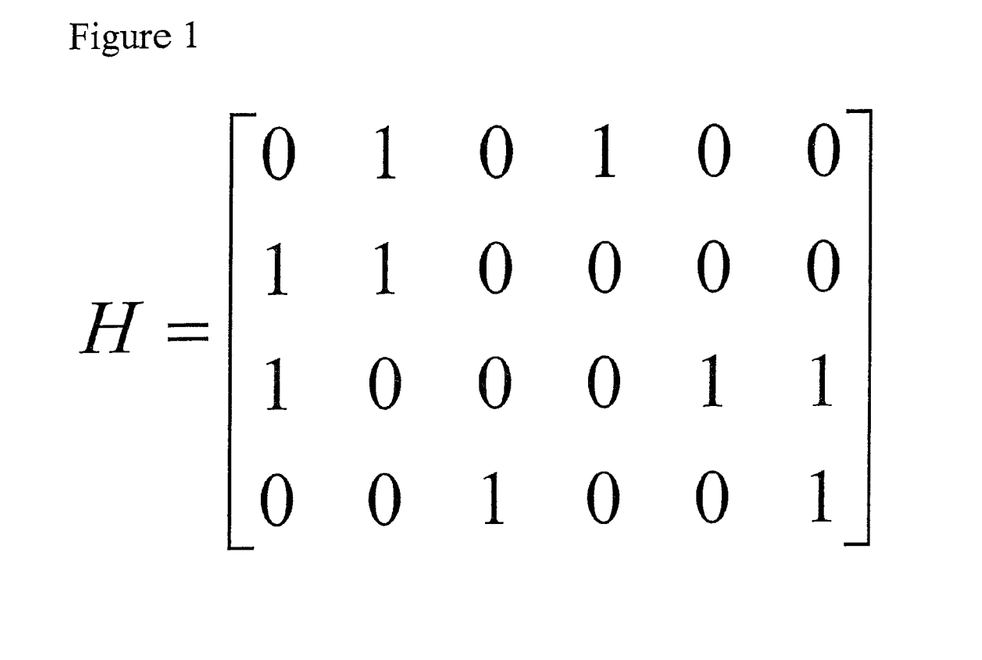
FIG. 1 is a parity check matrix representation of an exemplary irregular LDPC code of codeword length six.

Regular LDPC codes can be extended to form irregular LDPC codes, in which the weight of rows and columns vary. An irregular LDPC code is specified by degree distribution polynomials $v(x)$ and $c(x)$, which define the variable and check node degree distributions, respectively. More specifically, the irregular LDPC codes may be defined as follows:

$$v(x) = \sum_{j=1}^{d_{vmax}} v_j x^{j-1}, \text{ and} \quad (1)$$

$$c(x) = \sum_{j=1}^{d_{cmax}} c_j x^{j-1}, \quad (2)$$

where the variables $d_{v\,max}$ and $d_{c\,max}$ are a maximum variable node degree and a check node degree, respectively, and $v_j(c_j)$ represents the fraction of edges emanating from variable (check) nodes of degree j. While irregular LDPC codes can be more complicated to represent and/or implement than regular LDPC codes, it has been shown, both theoretically and empirically, that irregular LDPC codes with properly selected degree distributions outperform regular LDPC codes. FIG. 1 illustrates a parity check matrix representation of an exemplary irregular LDPC code of codeword length six.

LDPC codes can also be represented by bipartite graphs, or Tanner graphs. In Tanner graph, one set of nodes called variable nodes (or bit nodes) corresponds to the bits of the codeword and the other set of nodes called constraints nodes (or check nodes) corresponds the set of parity check constrains which define the LDPC code. Bit nodes and check nodes are connected by edges, and a bit node and a check node are said to be neighbors or adjacent if they are connected by an edge. Generally, it is assumed that a pair of nodes is connected by at most one edge.

Figure 2:
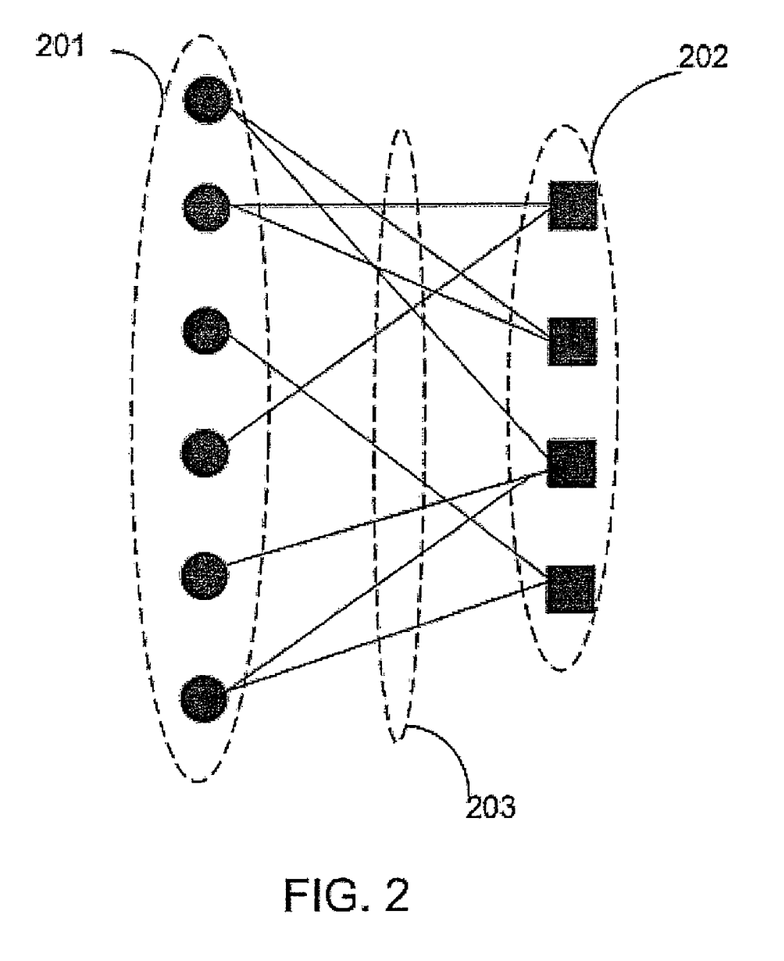
FIG. 2 illustrates a bipartite graph representation of the irregular LDPC code illustrated in FIG. 1.

FIG. 2 illustrates a bipartite graph representation of the irregular LDPC code illustrated in FIG. 1.

LDPC codes can be decoded in various ways such as majority-logic decoding and iterative decoding. Because of the structures of their parity check matrices, LDPC codes are majority-logic decodable. Although majority-logic decoding requires the least complexity and achieves reasonably good error performance for decoding some types of LDPC codes with relatively high column weights in their parity check matrices (e.g., Euclidean geometry LDPC and projective geometry LDPC codes), iterative decoding methods have received more attention due to their better performance versus complexity tradeoffs. Unlike majority-logic decoding, iterative decoding processes the received symbols recursively to improve the reliability of each symbol based on constraints that specify the code. In a first iteration, an iterative decoder only uses a channel output as input, and generates reliability output for each symbol.

Subsequently, the output reliability measures of the decoded symbols at the end of each decoding iteration are used as inputs for the next iteration. The decoding process continues until a stopping condition is satisfied, after which final decisions are made based on the output reliability measures of the decoded symbols from the last iteration. According to the different properties of reliability measures used during each iteration, iterative decoding algorithms can be further divided into hard decision, soft decision and hybrid decision algorithms. The corresponding popular algorithms are iterative bit-flipping (BF), belief propagation (BP), and weighted bit-flipping (WBF) decoding, respectively. Since BP algorithms have been proven to provide maximum likelihood decoding when the underlying Tanner graph is acyclic, they have become the most popular decoding methods.

BP for LDPC codes is a type of message passing decoding. Messages transmitted along the edges of a graph are log-likelihood ratio $$(LLR)^{\log \frac{p_0}{p_1}}$$

associated with variable nodes corresponding to codeword bits. In this expression $p_0$ and $p_1$ denote the probability that the associated bit value becomes either a 0 or a 1, respectively. BP decoding generally includes two steps, a horizontal step and a vertical step. In the horizontal step, each check node $c_m$ sends to each adjacent bit $b_n$ a check-to-bit message which is calculated based on all bit-to-check messages incoming to the check $c_m$ except one from bit $b_n$. In the vertical step, each bit node $b_n$ sends to each adjacent check node $c_m$ a bit-to-check message which is calculated based on all check-to-bit messages incoming to the bit $b_n$ except one from check node $c_m$. These two steps are repeated until a valid codeword is found or the maximum number of iterations is reached.

Because of its remarkable performance with BP decoding, irregular LDPC codes are among the best for many applications. Various irregular LDPC codes have been accepted or being considered for various communication and storage standards, such as DVB-S2/DAB, wireline ADSL, IEEE 802.11n, and IEEE 802.16.

The threshold of an LDPC code is defined as the smallest SNR value at which, as the codeword length tends to infinity, the bit error probability can be made arbitrarily small. The value of threshold of an LDPC code can be determined by analytical tool called density evolution.

The concept of density evolution can also be traced back to Gallager's results. To determine the performance of BF decoding, Gallager derived formulas to calculate the output BER for each iteration as a function of the input BER at the beginning of the iteration, and then iteratively calculated the BER at a given iteration. For a continuous alphabet, the calculation is more complex. The probability density functions (pdf's) of the belief messages exchanged between bit and check nodes need to be calculated from one iteration to the next, and the average BER for each iteration can be derived based on these pdf's. In both check node processing and bit node processing, each outgoing belief message is a function of incoming belief messages. For a check node of degree $d_c$, each outgoing message U can be expressed by a function of $d_c-1$ incoming messages, $$U=F_c(V_1, V_2, \ldots, V_{d_c-1}),$$

where $F_c$ denotes the check node processing function which is determined from BP decoding. Similarly, for bit node of degree $d_v$, each outgoing message V can be expressed by a function of $d_v-1$ incoming messages and the channel belief message $U_{ch}$, $$V=F_V(U_{ch}, U_1, U_2, \ldots, U_{d_v-1}),$$

where $F_v$ denotes the bit node processing function. Although for both check and bit node processing, the pdf of an outgoing message can be derived based on the pdf's of incoming messages for a given decoding algorithm, there may exist an exponentially large number of possible formats of incoming messages. Therefore the process of density evolution seems intractable. Fortunately, it has been proven in that for a given message-passing algorithm and noisy channel, if some symmetry conditions are satisfied, then the decoding BER is independent of the transmitted sequence x. That is to say, with the symmetry assumptions, the decoding BER of all-zero transmitted sequence x=1 is equal to that of any randomly chosen sequence, thus the derivation of density evolution can be considerably simplified. The symmetry conditions required by efficient density evolution are channel symmetry, check node symmetry, and bit node symmetry. Another assumption for the density evolution is that the Tanner graph is cyclic free.

According to these assumptions, the incoming messages to bit and check nodes are independent, and thus the derivation for the pdf of the outgoing messages can be considerably simplified. For many LDPC codes with practical interests, the corresponding Tanner graph contains cycles. When the minimum length of a cycle (or girth) in a Tanner graph of an LDPC code is equal to 4×l, then the independence assumption does not hold after the l-th decoding iteration with the standard BP decoding. However, for a given iteration number, as the code length increases, the independence condition is satisfied for an increasing iteration number. Therefore, the density evolution predicts the asymptotic performance of an ensemble of LDPC codes and the "asymptotic" nature is in the sense of code length.

A bit mapping scheme is provided for low density parity check (LDPC) encoded bits in 32APSK modulation systems. The disclosed bit mapping scheme provides good threshold of LDPC codes. Furthermore the bit mapping scheme can facilitate design of interleaving arrangement in 32APSK modulation system.

To propose a bit mapping approach for LDPC coded 32APSK systems. The disclosed bit mapping offers good performance of LDPC coded 32APSK system and simplifies interleaving arrangement in 32APSK systems.

BRIEF DESCRIPTION OF THE DRAWINGS

The present invention is illustrated by way of example, and not by way of limitation, in the figures of the corresponding drawings and in which like reference numerals refer to similar elements and in which.

DETAILED DESCRIPTION OF THE INVENTION

Referring to the accompanying drawings, a detailed description will be given of exemplary encoded bit mapping methods using LDPC codes according to various embodiments of the invention.

Although the invention is described with respect to LDPC codes, it is recognized that the bit mapping approach can be utilized with other codes. Furthermore, it is recognized that this approach can be implemented with uncoded systems.

Figure 5:
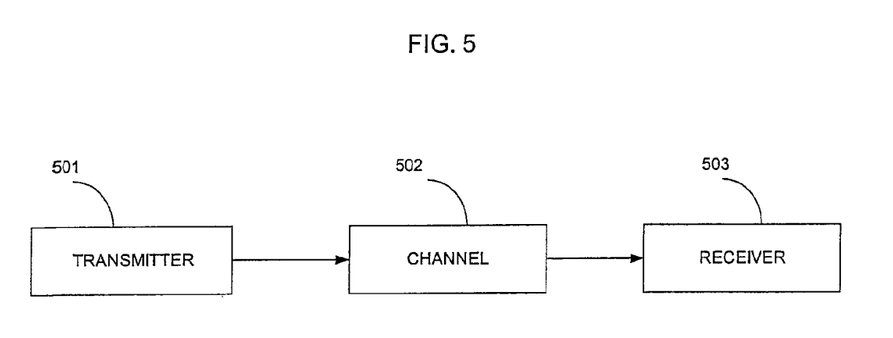
FIG. 5 depicts an exemplary communications system which employs LDPC codes and 32APSK modulation, according to various embodiments of the invention.

FIG. 5 is a diagram of a communications system employing LDPC codes with 32APSK modulation, according to an embodiment of the present invention. A communications system includes a transmitter 501 which generates signal waveforms across a communication channel 502 to a receiver 503. The transmitter 501 contains a message source producing a discrete set of possible messages. Each of these messages corresponds a signal waveform. The waveforms enter the channel 502 and are corrupted by noise. LDPC codes are employed to reduce the disturbances introduced by the channel 502 and a 32APSK modulation scheme is employed to transform LDPC encoded bits to signal waveforms.

Figure 6:
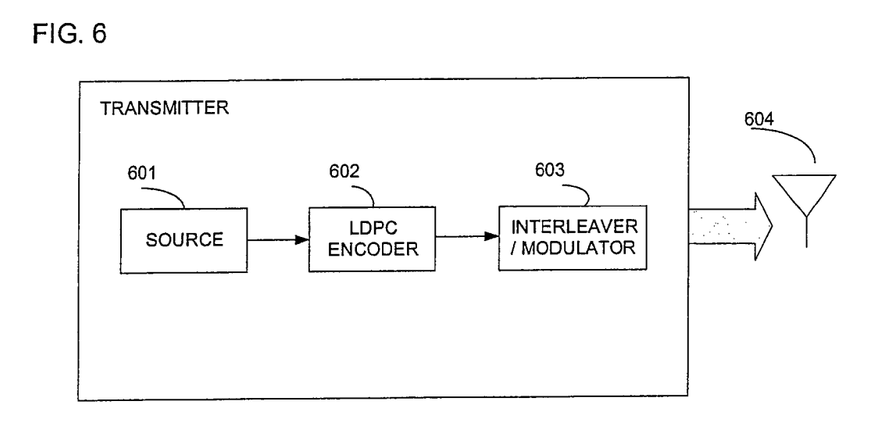
FIG. 6 depicts an exemplary transmitter employing 32APSK modulation in FIG. 5, according to various embodiments of the invention.

FIG. 6 depicts an exemplary transmitter in the communications system of FIG. 5 which employs LDPC codes and 32APSK modulation. The LDPC encoder 602 encodes information bits from source 601 into LDPC codewords. The mapping from each information block to each LDPC codeword is specified by the parity check matrix (or equivalently the generator matrix) of the LDPC code. The LDPC codeword is interleaved and modulated to signal waveforms by the interleaver/modulator 603 based on a 32APSK bit mapping scheme. These signal waveforms are sent to a transmit antenna 604 and propagated to a receiver shown in FIG. 7.

Figure 7:
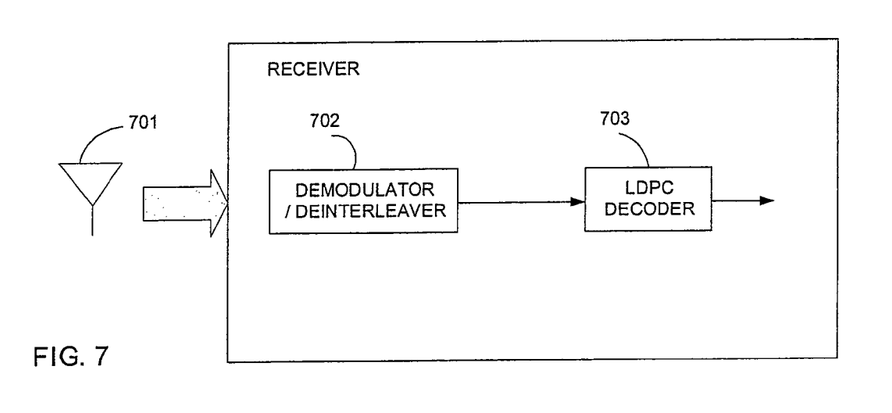
FIG. 7 depicts an exemplary receiver employing 32APSK demodulation in FIG. 5, according to various embodiments of the invention.

FIG. 7 depicts an exemplary receiver in FIG. 5 which employs LDPC codes and 32APSK demodulator. Signal waveforms are received by the receiving antenna 701 and distributed to demodulator/deinterleavor 702. Signal waveforms are demodulated by demodulator and deinterleaved by deinterleavor and then distributed to a LDPC decoder 703 which iteratively decodes the received messages and output estimations of the transmitted codeword. The 32APSK demodulation rule employed by the demodulator/deinterleaver 702 should match with the 32APSK modulation rule employed by the interleaver/modulator 603.

Figure 3:
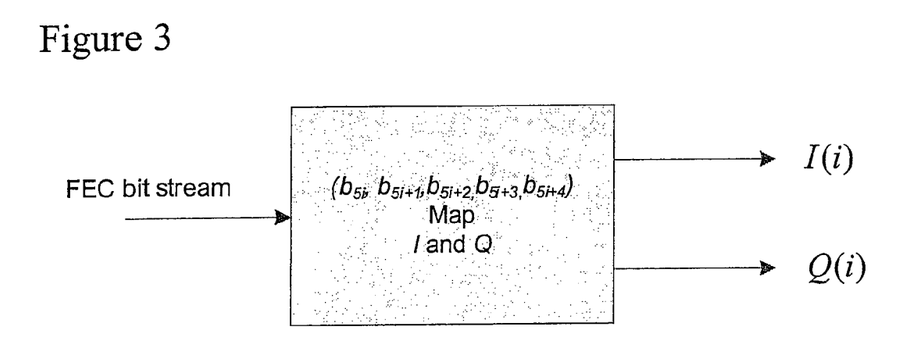
FIG. 3 illustrates the bit mapping block in 32APSK modulation, according to various embodiments of the invention.
Figure 4:
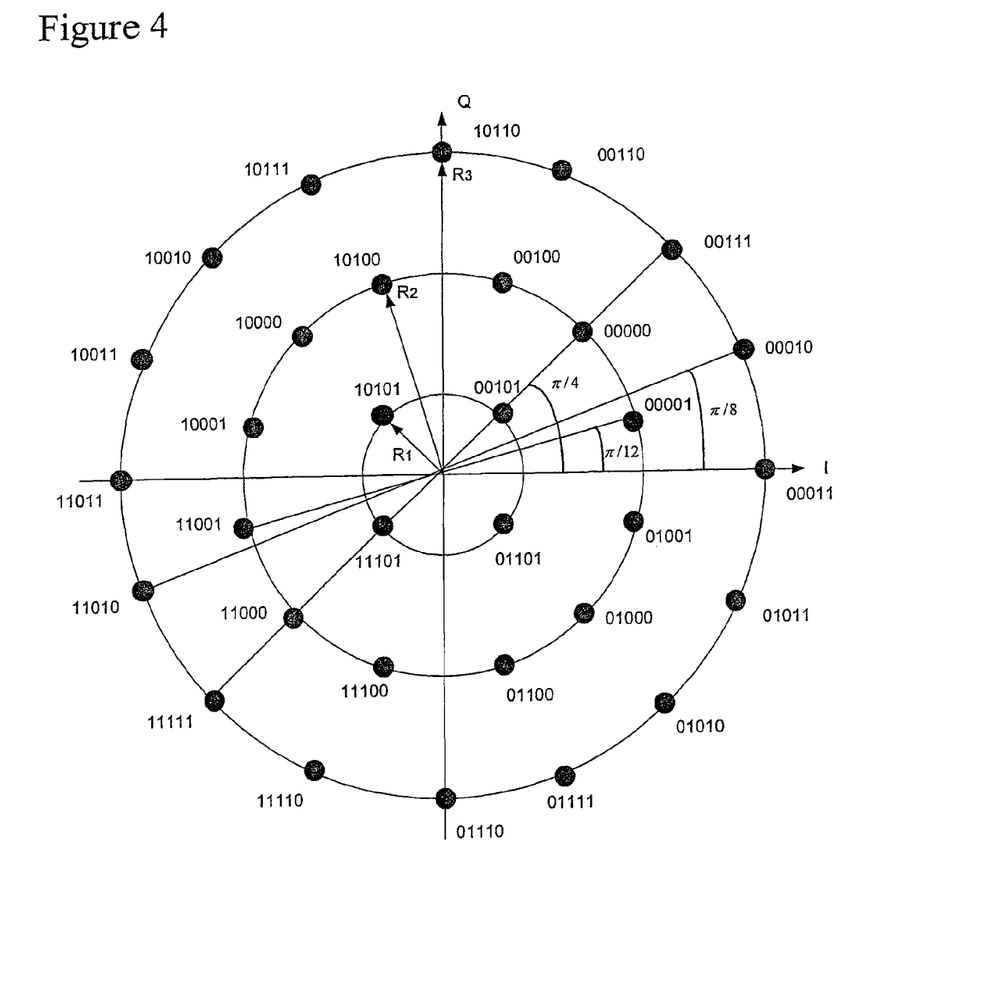
FIG. 4 illustrates a bit map for 32APSK symbol, according to various embodiments of the invention.

According to various embodiments of the invention, as shown in FIG. 3, the 32APSK bit-to-symbol mapping circuit may utilize five bits ($b_{5i}$, $b_{5i+1}$, $b_{5i+2}$, $b_{5i+3}$, $b_{5i+4}$) each iteration and map them into an I value and a Q value, with $i=0, 1, 2, \ldots$. The bit mapping logic is shown in FIG. 4. The bit mapping according to various embodiments of the invention is defined as follows:

$$(I(i), Q(i)) = \begin{cases} (R_2\cos(\pi/4), R_2\sin(\pi/4)), & (b_{5i}, b_{5i+1}, b_{5i+2}, b_{5i+3}, b_{5i+4}) = (0, 0, 0, 0, 0) \\ (R_2\cos(\pi/12), R_2\sin(\pi/12)), & (b_{5i}, b_{5i+1}, b_{5i+2}, b_{5i+3}, b_{5i+4}) = (0, 0, 0, 0, 1) \\ (R_3\cos(\pi/8), R_3\sin(\pi/8)), & (b_{5i}, b_{5i+1}, b_{5i+2}, b_{5i+3}, b_{5i+4}) = (0, 0, 0, 1, 0) \\ (R_3, 0), & (b_{5i}, b_{5i+1}, b_{5i+2}, b_{5i+3}, b_{5i+4}) = (0, 0, 0, 1, 1) \\ (R_2\sin(\pi/12), R_2\cos(\pi/12)), & (b_{5i}, b_{5i+1}, b_{5i+2}, b_{5i+3}, b_{5i+4}) = (0, 0, 1, 0, 0) \\ (R_1\cos(\pi/4), R_1\sin(\pi/4)), & (b_{5i}, b_{5i+1}, b_{5i+2}, b_{5i+3}, b_{5i+4}) = (0, 0, 1, 0, 1) \\ (R_3\sin(\pi/8), R_3\cos(\pi/8)), & (b_{5i}, b_{5i+1}, b_{5i+2}, b_{5i+3}, b_{5i+4}) = (0, 0, 1, 1, 0) \\ (R_3\cos(\pi/4), R_3\sin(\pi/4)), & (b_{5i}, b_{5i+1}, b_{5i+2}, b_{5i+3}, b_{5i+4}) = (0, 0, 1, 1, 1) \\ (R_2\cos(\pi/4), -R_2\sin(\pi/4)), & (b_{5i}, b_{5i+1}, b_{5i+2}, b_{5i+3}, b_{5i+4}) = (0, 1, 0, 0, 0) \\ (R_2\cos(\pi/12), -R_2\sin(\pi/12)), & (b_{5i}, b_{5i+1}, b_{5i+2}, b_{5i+3}, b_{5i+4}) = (0, 1, 0, 0, 1) \end{cases}$$

$$\begin{cases} (R_3\cos(\pi/4), -R_3\sin(\pi/4)), & (b_{5i}, b_{5i+1}, b_{5i+2}, b_{5i+3}, b_{5i+4}) = (0, 1, 0, 1, 0) \\ (R_3\cos(\pi/8), -R_3\sin(\pi/8)), & (b_{5i}, b_{5i+1}, b_{5i+2}, b_{5i+3}, b_{5i+4}) = (0, 1, 0, 1, 1) \\ (R_2\sin(\pi/12), -R_2\cos(\pi/12)), & (b_{5i}, b_{5i+1}, b_{5i+2}, b_{5i+3}, b_{5i+4}) = (0, 1, 1, 0, 0) \\ (R_1\cos(\pi/4), -R_1\sin(\pi/4)), & (b_{5i}, b_{5i+1}, b_{5i+2}, b_{5i+3}, b_{5i+4}) = (0, 1, 1, 0, 1) \\ (0, -R_3), & (b_{5i}, b_{5i+1}, b_{5i+2}, b_{5i+3}, b_{5i+4}) = (0, 1, 1, 1, 0) \\ (R_3\sin(\pi/8), -R_3\cos(\pi/8)), & (b_{5i}, b_{5i+1}, b_{5i+2}, b_{5i+3}, b_{5i+4}) = (0, 1, 1, 1, 1) \\ (-R_2\cos(\pi/4), R_2\sin(\pi/4)), & (b_{5i}, b_{5i+1}, b_{5i+2}, b_{5i+3}, b_{5i+4}) = (1, 0, 0, 0, 0) \\ (-R_2\cos(\pi/12), R_2\sin(\pi/12)), & (b_{5i}, b_{5i+1}, b_{5i+2}, b_{5i+3}, b_{5i+4}) = (1, 0, 0, 0, 1) \\ (-R_3\cos(\pi/4), R_3\sin(\pi/4)), & (b_{5i}, b_{5i+1}, b_{5i+2}, b_{5i+3}, b_{5i+4}) = (1, 0, 0, 1, 0) \\ (-R_3\cos(\pi/8), R_3\sin(\pi/8)), & (b_{5i}, b_{5i+1}, b_{5i+2}, b_{5i+3}, b_{5i+4}) = (1, 0, 0, 1, 1) \end{cases}$$

$$\begin{cases} (-R_2\sin(\pi/12), R_2\cos(\pi/12)), & (b_{5i}, b_{5i+1}, b_{5i+2}, b_{5i+3}, b_{5i+4}) = (1, 0, 1, 0, 0) \\ (-R_1\cos(\pi/4), R_1\sin(\pi/4)), & (b_{5i}, b_{5i+1}, b_{5i+2}, b_{5i+3}, b_{5i+4}) = (1, 0, 1, 0, 1) \\ (0, R_3), & (b_{5i}, b_{5i+1}, b_{5i+2}, b_{5i+3}, b_{5i+4}) = (1, 0, 1, 1, 0) \\ (-R_3\sin(\pi/8), R_3\cos(\pi/8)), & (b_{5i}, b_{5i+1}, b_{5i+2}, b_{5i+3}, b_{5i+4}) = (1, 0, 1, 1, 1) \\ (-R_2\cos(\pi/4), -R_2\sin(\pi/4)), & (b_{5i}, b_{5i+1}, b_{5i+2}, b_{5i+3}, b_{5i+4}) = (1, 1, 0, 0, 0) \\ (-R_2\cos(\pi/12), -R_2\sin(\pi/12)), & (b_{5i}, b_{5i+1}, b_{5i+2}, b_{5i+3}, b_{5i+4}) = (1, 1, 0, 0, 1) \\ (-R_3\cos(\pi/8), -R_3\sin(\pi/8)), & (b_{5i}, b_{5i+1}, b_{5i+2}, b_{5i+3}, b_{5i+4}) = (1, 1, 0, 1, 0) \\ (-R_3, 0), & (b_{5i}, b_{5i+1}, b_{5i+2}, b_{5i+3}, b_{5i+4}) = (1, 1, 0, 1, 1) \\ (-R_2\sin(\pi/12), -R_2\cos(\pi/12)), & (b_{5i}, b_{5i+1}, b_{5i+2}, b_{5i+3}, b_{5i+4}) = (1, 1, 1, 0, 0) \\ (-R_1\cos(\pi/4), -R_1\sin(\pi/4)), & (b_{5i}, b_{5i+1}, b_{5i+2}, b_{5i+3}, b_{5i+4}) = (1, 1, 1, 0, 1) \\ (-R_3\sin(\pi/8), -R_3\cos(\pi/8)), & (b_{5i}, b_{5i+1}, b_{5i+2}, b_{5i+3}, b_{5i+4}) = (1, 1, 1, 1, 0) \\ (-R_3\cos(\pi/4), -R_3\sin(\pi/4)), & (b_{5i}, b_{5i+1}, b_{5i+2}, b_{5i+3}, b_{5i+4}) = (1, 1, 1, 1, 1) \end{cases}$$

According to various embodiments of the invention, the bit mapping scheme of FIG. 4 may use gray mapping which means the binary representations of adjacent points differ by only one bit. Density evolution analysis shows that given an LDPC coded 32APSK system, gray mapping scheme can provide the best threshold. The bit mapping scheme of FIG. 4 also arranges bit in an order based on the values of log likelihood ratio from communications channel. This arrangement simplifies the design of interleaving scheme for 32APSK system. It is also appreciated that bit mapping scheme of the invention may be implemented on a computer readable medium and executed by a processor or computer, as understood by the skilled artisan.

Although the invention has been described by the way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method of bit mapping in a 32APSK system, the method comprising:

transmitting a digital signal from a transmitter; and receiving the digital signal at a receiver;

wherein the digital signal utilizes a 32APSK system, and the signal is bit-mapped prior to the transmitting according to the following formula:

$$(I(i), Q(i)) = \begin{cases} (R_2\cos(\pi/4), R_2\sin(\pi/4)), \\ (R_2\cos(\pi/12), R_2\sin(\pi/12)), \\ (R_3\cos(\pi/8), R_3\sin(\pi/8)), \\ (R_3, 0), \\ (R_2\sin(\pi/12), R_2\cos(\pi/12)), \\ (R_1\cos(\pi/4), R_1\sin(\pi/4)), \\ (R_3\sin(\pi/8), R_3\cos(\pi/8)), \\ (R_3\cos(\pi/4), R_3\sin(\pi/4)), \\ (R_2\cos(\pi/4), -R_2\sin(\pi/4)), \\ (R_2\cos(\pi/12), -R_2\sin(\pi/12)), \\ (b_{5i}, b_{5i+1}, b_{5i+2}, b_{5i+3}, b_{5i+4}) = (0, 0, 0, 0, 0) \\ (b_{5i}, b_{5i+1}, b_{5i+2}, b_{5i+3}, b_{5i+4}) = (0, 0, 0, 0, 1) \\ (b_{5i}, b_{5i+1}, b_{5i+2}, b_{5i+3}, b_{5i+4}) = (0, 0, 0, 1, 0) \\ (b_{5i}, b_{5i+1}, b_{5i+2}, b_{5i+3}, b_{5i+4}) = (0, 0, 0, 1, 1) \\ (b_{5i}, b_{5i+1}, b_{5i+2}, b_{5i+3}, b_{5i+4}) = (0, 0, 1, 0, 0) \\ (b_{5i}, b_{5i+1}, b_{5i+2}, b_{5i+3}, b_{5i+4}) = (0, 0, 1, 0, 1) \\ (b_{5i}, b_{5i+1}, b_{5i+2}, b_{5i+3}, b_{5i+4}) = (0, 0, 1, 1, 0) \\ (b_{5i}, b_{5i+1}, b_{5i+2}, b_{5i+3}, b_{5i+4}) = (0, 0, 1, 1, 1) \\ (b_{5i}, b_{5i+1}, b_{5i+2}, b_{5i+3}, b_{5i+4}) = (0, 1, 0, 0, 0) \\ (b_{5i}, b_{5i+1}, b_{5i+2}, b_{5i+3}, b_{5i+4}) = (0, 1, 0, 0, 1) \end{cases}$$

-continued $$\begin{cases} (R_3\cos(\pi/4), -R_3\sin(\pi/4)), \\ (R_3\cos(\pi/8), -R_3\sin(\pi/8)), \\ (R_2\sin(\pi/12), -R_2\cos(\pi/12)), \\ (R_1\cos(\pi/4), -R_1\sin(\pi/4)), \\ (0, -R_3), \\ (R_3\sin(\pi/8), -R_3\cos(\pi/8)), \\ (-R_2\cos(\pi/4), R_2\sin(\pi/4)), \\ (-R_2\cos(\pi/12), R_2\sin(\pi/12)), \\ (-R_3\cos(\pi/4), R_3\sin(\pi/4)), \\ (-R_3\cos(\pi/8), R_3\sin(\pi/8)), \\ (b_{5i}, b_{5i+1}, b_{5i+2}, b_{5i+3}, b_{5i+4}) = (0, 1, 0, 1, 0) \\ (b_{5i}, b_{5i+1}, b_{5i+2}, b_{5i+3}, b_{5i+4}) = (0, 1, 0, 1, 1) \\ (b_{5i}, b_{5i+1}, b_{5i+2}, b_{5i+3}, b_{5i+4}) = (0, 1, 1, 0, 0) \\ (b_{5i}, b_{5i+1}, b_{5i+2}, b_{5i+3}, b_{5i+4}) = (0, 1, 1, 0, 1) \\ (b_{5i}, b_{5i+1}, b_{5i+2}, b_{5i+3}, b_{5i+4}) = (0, 1, 1, 1, 0) \\ (b_{5i}, b_{5i+1}, b_{5i+2}, b_{5i+3}, b_{5i+4}) = (0, 1, 1, 1, 1) \\ (b_{5i}, b_{5i+1}, b_{5i+2}, b_{5i+3}, b_{5i+4}) = (1, 0, 0, 0, 0) \\ (b_{5i}, b_{5i+1}, b_{5i+2}, b_{5i+3}, b_{5i+4}) = (1, 0, 0, 0, 1) \\ (b_{5i}, b_{5i+1}, b_{5i+2}, b_{5i+3}, b_{5i+4}) = (1, 0, 0, 1, 0) \\ (b_{5i}, b_{5i+1}, b_{5i+2}, b_{5i+3}, b_{5i+4}) = (1, 0, 0, 1, 1) \end{cases}$$

$$\begin{cases} (-R_2\sin(\pi/12), R_2\cos(\pi/12)), \\ (-R_1\cos(\pi/4), R_1\sin(\pi/4)), \\ (0, R_3), \\ (-R_3\sin(\pi/8), R_3\cos(\pi/8)), \\ (-R_2\cos(\pi/4), -R_2\sin(\pi/4)), \\ (-R_2\cos(\pi/12), -R_2\sin(\pi/12)), \\ (-R_3\cos(\pi/8), -R_3\sin(\pi/8)), \\ (-R_3, 0), \\ (-R_2\sin(\pi/12), -R_2\cos(\pi/12)), \\ (-R_1\cos(\pi/4), -R_1\sin(\pi/4)), \\ (-R_3\sin(\pi/8), -R_3\cos(\pi/8)), \\ (-R_3\cos(\pi/4), -R_3\sin(\pi/4)), \\ (b_{5i}, b_{5i+1}, b_{5i+2}, b_{5i+3}, b_{5i+4}) = (1, 0, 1, 0, 0) \\ (b_{5i}, b_{5i+1}, b_{5i+2}, b_{5i+3}, b_{5i+4}) = (1, 0, 1, 0, 1) \\ (b_{5i}, b_{5i+1}, b_{5i+2}, b_{5i+3}, b_{5i+4}) = (1, 0, 1, 1, 0) \\ (b_{5i}, b_{5i+1}, b_{5i+2}, b_{5i+3}, b_{5i+4}) = (1, 0, 1, 1, 1) \\ (b_{5i}, b_{5i+1}, b_{5i+2}, b_{5i+3}, b_{5i+4}) = (1, 1, 0, 0, 0) \\ (b_{5i}, b_{5i+1}, b_{5i+2}, b_{5i+3}, b_{5i+4}) = (1, 1, 0, 0, 1) \\ (b_{5i}, b_{5i+1}, b_{5i+2}, b_{5i+3}, b_{5i+4}) = (1, 1, 0, 1, 0) \\ (b_{5i}, b_{5i+1}, b_{5i+2}, b_{5i+3}, b_{5i+4}) = (1, 1, 0, 1, 1) \\ (b_{5i}, b_{5i+1}, b_{5i+2}, b_{5i+3}, b_{5i+4}) = (1, 1, 1, 0, 0) \\ (b_{5i}, b_{5i+1}, b_{5i+2}, b_{5i+3}, b_{5i+4}) = (1, 1, 1, 0, 1) \\ (b_{5i}, b_{5i+1}, b_{5i+2}, b_{5i+3}, b_{5i+4}) = (1, 1, 1, 1, 0) \\ (b_{5i}, b_{5i+1}, b_{5i+2}, b_{5i+3}, b_{5i+4}) = (1, 1, 1, 1, 1) \end{cases}$$

wherein R1 is a radius of an inner ring, R2 is a radius of an intermediate ring and R3 is a radius of an outer ring.

2. The method of claim 1, wherein an FEC code is used.

3. The method of claim 2, wherein the FEC code is regular LDPC code.

4. The method of claim 2, wherein the FEC code is irregular LDPC code.

5. The method of claim 2, wherein the FEC code is regular repeat-accumulate code.

6. The method of claim 2, wherein the FEC code is irregular repeat-accumulate code.

7. A digital communications system, comprising: a transmitter to modulate at least one mapping group having five bits ($b_{5i}$, $b_{5i+1}$, $b_{5i+2}$, $b_{5i+3}$, $b_{5i+4}$), for i=0, 1, 2, . . . , to 32APSK symbols based on formula:

$$(I(i), Q(i)) = \begin{cases} (R_2\cos(\pi/4), R_2\sin(\pi/4)), & (b_{5i}, b_{5i+1}, b_{5i+2}, b_{5i+3}, b_{5i+4}) = (0,0,0,0,0) \\ (R_2\cos(\pi/12), R_2\sin(\pi/12)), & (b_{5i}, b_{5i+1}, b_{5i+2}, b_{5i+3}, b_{5i+4}) = (0,0,0,0,1) \\ (R_3\cos(\pi/8), R_3\sin(\pi/8)), & (b_{5i}, b_{5i+1}, b_{5i+2}, b_{5i+3}, b_{5i+4}) = (0,0,0,1,0) \\ (R_3, 0), & (b_{5i}, b_{5i+1}, b_{5i+2}, b_{5i+3}, b_{5i+4}) = (0,0,0,1,1) \\ (R_2\sin(\pi/12), R_2\cos(\pi/12)), & (b_{5i}, b_{5i+1}, b_{5i+2}, b_{5i+3}, b_{5i+4}) = (0,0,1,0,0) \\ (R_1\cos(\pi/4), R_1\sin(\pi/4)), & (b_{5i}, b_{5i+1}, b_{5i+2}, b_{5i+3}, b_{5i+4}) = (0,0,1,0,1) \\ (R_3\sin(\pi/8), R_3\cos(\pi/8)), & (b_{5i}, b_{5i+1}, b_{5i+2}, b_{5i+3}, b_{5i+4}) = (0,0,1,1,0) \\ (R_3\cos(\pi/4), R_3\sin(\pi/4)), & (b_{5i}, b_{5i+1}, b_{5i+2}, b_{5i+3}, b_{5i+4}) = (0,0,1,1,1) \\ (R_2\cos(\pi/4), -R_2\sin(\pi/4)), & (b_{5i}, b_{5i+1}, b_{5i+2}, b_{5i+3}, b_{5i+4}) = (0,1,0,0,0) \\ (R_2\cos(\pi/12), -R_2\sin(\pi/12)), & (b_{5i}, b_{5i+1}, b_{5i+2}, b_{5i+3}, b_{5i+4}) = (0,1,0,0,1) \\ (R_3\cos(\pi/4), -R_3\sin(\pi/4)), & (b_{5i}, b_{5i+1}, b_{5i+2}, b_{5i+3}, b_{5i+4}) = (0,1,0,1,0) \\ (R_3\cos(\pi/8), -R_3\sin(\pi/8)), & (b_{5i}, b_{5i+1}, b_{5i+2}, b_{5i+3}, b_{5i+4}) = (0,1,0,1,1) \\ (R_2\sin(\pi/12), -R_2\cos(\pi/12)), & (b_{5i}, b_{5i+1}, b_{5i+2}, b_{5i+3}, b_{5i+4}) = (0,1,1,0,0) \\ (R_1\cos(\pi/4), -R_1\sin(\pi/4)), & (b_{5i}, b_{5i+1}, b_{5i+2}, b_{5i+3}, b_{5i+4}) = (0,1,1,0,1) \\ (0, -R_3), & (b_{5i}, b_{5i+1}, b_{5i+2}, b_{5i+3}, b_{5i+4}) = (0,1,1,1,0) \\ (R_3\sin(\pi/8), -R_3\cos(\pi/8)), & (b_{5i}, b_{5i+1}, b_{5i+2}, b_{5i+3}, b_{5i+4}) = (0,1,1,1,1) \\ (-R_2\cos(\pi/4), R_2\sin(\pi/4)), & (b_{5i}, b_{5i+1}, b_{5i+2}, b_{5i+3}, b_{5i+4}) = (1,0,0,0,0) \\ (-R_2\cos(\pi/12), R_2\sin(\pi/12)), & (b_{5i}, b_{5i+1}, b_{5i+2}, b_{5i+3}, b_{5i+4}) = (1,0,0,0,1) \\ (-R_3\cos(\pi/4), R_3\sin(\pi/4)), & (b_{5i}, b_{5i+1}, b_{5i+2}, b_{5i+3}, b_{5i+4}) = (1,0,0,1,0) \\ (-R_3\cos(\pi/8), R_3\sin(\pi/8)), & (b_{5i}, b_{5i+1}, b_{5i+2}, b_{5i+3}, b_{5i+4}) = (1,0,0,1,1) \\ (-R_2\sin(\pi/12), R_2\cos(\pi/12)), & (b_{5i}, b_{5i+1}, b_{5i+2}, b_{5i+3}, b_{5i+4}) = (1,0,1,0,0) \\ (-R_1\cos(\pi/4), R_1\sin(\pi/4)), & (b_{5i}, b_{5i+1}, b_{5i+2}, b_{5i+3}, b_{5i+4}) = (1,0,1,0,1) \\ (0, R_3), & (b_{5i}, b_{5i+1}, b_{5i+2}, b_{5i+3}, b_{5i+4}) = (1,0,1,1,0) \\ (-R_3\sin(\pi/8), R_3\cos(\pi/8)), & (b_{5i}, b_{5i+1}, b_{5i+2}, b_{5i+3}, b_{5i+4}) = (1,0,1,1,1) \\ (-R_2\cos(\pi/4), -R_2\sin(\pi/4)), & (b_{5i}, b_{5i+1}, b_{5i+2}, b_{5i+3}, b_{5i+4}) = (1,1,0,0,0) \\ (-R_2\cos(\pi/12), -R_2\sin(\pi/12)), & (b_{5i}, b_{5i+1}, b_{5i+2}, b_{5i+3}, b_{5i+4}) = (1,1,0,0,1) \\ (-R_3\cos(\pi/8), -R_3\sin(\pi/8)), & (b_{5i}, b_{5i+1}, b_{5i+2}, b_{5i+3}, b_{5i+4}) = (1,1,0,1,0) \\ (-R_3, 0), & (b_{5i}, b_{5i+1}, b_{5i+2}, b_{5i+3}, b_{5i+4}) = (1,1,0,1,1) \\ (-R_2\sin(\pi/12), -R_2\cos(\pi/12)), & (b_{5i}, b_{5i+1}, b_{5i+2}, b_{5i+3}, b_{5i+4}) = (1,1,1,0,0) \\ (-R_1\cos(\pi/4), -R_1\sin(\pi/4)), & (b_{5i}, b_{5i+1}, b_{5i+2}, b_{5i+3}, b_{5i+4}) = (1,1,1,0,1) \\ (-R_3\sin(\pi/8), -R_3\cos(\pi/8)), & (b_{5i}, b_{5i+1}, b_{5i+2}, b_{5i+3}, b_{5i+4}) = (1,1,1,1,0) \\ (-R_3\cos(\pi/4), -R_3\sin(\pi/4)), & (b_{5i}, b_{5i+1}, b_{5i+2}, b_{5i+3}, b_{5i+4}) = (1,1,1,1,1) \end{cases}$$

wherein $R_1$ is a radius of an inner ring, $R_2$ is a radius of an intermediate ring, and $R_3$ is a radius of an outer ring.

8. A digital communications system, comprising: a receiver to demodulate at least one mapped 32APSK symbol to an estimating message group having five bits (b5i, b5i+1, b5i+2, b5i+3, b5i+4), for i=0, 1, 2, . . . , based on a 32APSK constellation specification:

$$(I(i), Q(i)) = \begin{cases} (R_2\cos(\pi/4), R_2\sin(\pi/4)), & (b_{5i}, b_{5i+1}, b_{5i+2}, b_{5i+3}, b_{5i+4}) = (0, 0, 0, 0, 0) \\ (R_2\cos(\pi/12), R_2\sin(\pi/12)), & (b_{5i}, b_{5i+1}, b_{5i+2}, b_{5i+3}, b_{5i+4}) = (0, 0, 0, 0, 1) \\ (R_3\cos(\pi/8), R_3\sin(\pi/8)), & (b_{5i}, b_{5i+1}, b_{5i+2}, b_{5i+3}, b_{5i+4}) = (0, 0, 0, 1, 0) \\ (R_3, 0), & (b_{5i}, b_{5i+1}, b_{5i+2}, b_{5i+3}, b_{5i+4}) = (0, 0, 0, 1, 1) \\ (R_2\sin(\pi/12), R_2\cos(\pi/12)), & (b_{5i}, b_{5i+1}, b_{5i+2}, b_{5i+3}, b_{5i+4}) = (0, 0, 1, 0, 0) \\ (R_1\cos(\pi/4), R_1\sin(\pi/4)), & (b_{5i}, b_{5i+1}, b_{5i+2}, b_{5i+3}, b_{5i+4}) = (0, 0, 1, 0, 1) \\ (R_3\sin(\pi/8), R_3\cos(\pi/8)), & (b_{5i}, b_{5i+1}, b_{5i+2}, b_{5i+3}, b_{5i+4}) = (0, 0, 1, 1, 0) \\ (R_3\cos(\pi/4), R_3\sin(\pi/4)), & (b_{5i}, b_{5i+1}, b_{5i+2}, b_{5i+3}, b_{5i+4}) = (0, 0, 1, 1, 1) \\ (R_2\cos(\pi/4), -R_2\sin(\pi/4)), & (b_{5i}, b_{5i+1}, b_{5i+2}, b_{5i+3}, b_{5i+4}) = (0, 1, 0, 0, 0) \\ (R_2\cos(\pi/12), -R_2\sin(\pi/12)), & (b_{5i}, b_{5i+1}, b_{5i+2}, b_{5i+3}, b_{5i+4}) = (0, 1, 0, 0, 1) \end{cases}$$

$$\begin{cases} (R_3\cos(\pi/4), -R_3\sin(\pi/4)), & (b_{5i}, b_{5i+1}, b_{5i+2}, b_{5i+3}, b_{5i+4}) = (0, 1, 0, 1, 0) \\ (R_3\cos(\pi/8), -R_3\sin(\pi/8)), & (b_{5i}, b_{5i+1}, b_{5i+2}, b_{5i+3}, b_{5i+4}) = (0, 1, 0, 1, 1) \\ (R_2\sin(\pi/12), -R_2\cos(\pi/12)), & (b_{5i}, b_{5i+1}, b_{5i+2}, b_{5i+3}, b_{5i+4}) = (0, 1, 1, 0, 0) \\ (R_1\cos(\pi/4), -R_1\sin(\pi/4)), & (b_{5i}, b_{5i+1}, b_{5i+2}, b_{5i+3}, b_{5i+4}) = (0, 1, 1, 0, 1) \\ (0, -R_3), & (b_{5i}, b_{5i+1}, b_{5i+2}, b_{5i+3}, b_{5i+4}) = (0, 1, 1, 1, 0) \\ (R_3\sin(\pi/8), -R_3\cos(\pi/8)), & (b_{5i}, b_{5i+1}, b_{5i+2}, b_{5i+3}, b_{5i+4}) = (0, 1, 1, 1, 1) \\ (-R_2\cos(\pi/4), R_2\sin(\pi/4)), & (b_{5i}, b_{5i+1}, b_{5i+2}, b_{5i+3}, b_{5i+4}) = (1, 0, 0, 0, 0) \\ (-R_2\cos(\pi/12), R_2\sin(\pi/12)), & (b_{5i}, b_{5i+1}, b_{5i+2}, b_{5i+3}, b_{5i+4}) = (1, 0, 0, 0, 1) \\ (-R_3\cos(\pi/4), R_3\sin(\pi/4)), & (b_{5i}, b_{5i+1}, b_{5i+2}, b_{5i+3}, b_{5i+4}) = (1, 0, 0, 1, 0) \\ (-R_3\cos(\pi/8), R_3\sin(\pi/8)), & (b_{5i}, b_{5i+1}, b_{5i+2}, b_{5i+3}, b_{5i+4}) = (1, 0, 0, 1, 1) \end{cases}$$

$$\begin{cases} (-R_2\sin(\pi/12), R_2\cos(\pi/12)), & (b_{5i}, b_{5i+1}, b_{5i+2}, b_{5i+3}, b_{5i+4}) = (1, 0, 1, 0, 0) \\ (-R_1\cos(\pi/4), R_1\sin(\pi/4)), & (b_{5i}, b_{5i+1}, b_{5i+2}, b_{5i+3}, b_{5i+4}) = (1, 0, 1, 0, 1) \\ (0, R_3), & (b_{5i}, b_{5i+1}, b_{5i+2}, b_{5i+3}, b_{5i+4}) = (1, 0, 1, 1, 0) \\ (-R_3\sin(\pi/8), R_3\cos(\pi/8)), & (b_{5i}, b_{5i+1}, b_{5i+2}, b_{5i+3}, b_{5i+4}) = (1, 0, 1, 1, 1) \\ (-R_2\cos(\pi/4), -R_2\sin(\pi/4)), & (b_{5i}, b_{5i+1}, b_{5i+2}, b_{5i+3}, b_{5i+4}) = (1, 1, 0, 0, 0) \\ (-R_2\cos(\pi/12), -R_2\sin(\pi/12)), & (b_{5i}, b_{5i+1}, b_{5i+2}, b_{5i+3}, b_{5i+4}) = (1, 1, 0, 0, 1) \\ (-R_3\cos(\pi/8), -R_3\sin(\pi/8)), & (b_{5i}, b_{5i+1}, b_{5i+2}, b_{5i+3}, b_{5i+4}) = (1, 1, 0, 1, 0) \\ (-R_3, 0), & (b_{5i}, b_{5i+1}, b_{5i+2}, b_{5i+3}, b_{5i+4}) = (1, 1, 0, 1, 1) \\ (-R_2\sin(\pi/12), -R_2\cos(\pi/12)), & (b_{5i}, b_{5i+1}, b_{5i+2}, b_{5i+3}, b_{5i+4}) = (1, 1, 1, 0, 0) \\ (-R_1\cos(\pi/4), -R_1\sin(\pi/4)), & (b_{5i}, b_{5i+1}, b_{5i+2}, b_{5i+3}, b_{5i+4}) = (1, 1, 1, 0, 1) \\ (-R_3\sin(\pi/8), -R_3\cos(\pi/8)), & (b_{5i}, b_{5i+1}, b_{5i+2}, b_{5i+3}, b_{5i+4}) = (1, 1, 1, 1, 0) \\ (-R_3\cos(\pi/4), -R_3\sin(\pi/4)), & (b_{5i}, b_{5i+1}, b_{5i+2}, b_{5i+3}, b_{5i+4}) = (1, 1, 1, 1, 1) \end{cases}$$

wherein $R_1$ is a radius of an inner ring, $R_2$ is a radius of an intermediate ring, and $R_3$ is a radius of an outer ring.

9. A non-transitory computer readable medium to store a computer program, executable by a processor, to map at least one group of five bits (b5i, b5i+1, b5i+2, b5i+3, b5i+4), for i=0, 1, 2, ..., to a 32APSK symbol based on a formula:

$$(I(i), Q(i)) = \begin{cases} (R_2\cos(\pi/4), R_2\sin(\pi/4)), & (b_{5i}, b_{5i+1}, b_{5i+2}, b_{5i+3}, b_{5i+4}) = (0, 0, 0, 0, 0) \\ (R_2\cos(\pi/12), R_2\sin(\pi/12)), & (b_{5i}, b_{5i+1}, b_{5i+2}, b_{5i+3}, b_{5i+4}) = (0, 0, 0, 0, 1) \\ (R_3\cos(\pi/8), R_3\sin(\pi/8)), & (b_{5i}, b_{5i+1}, b_{5i+2}, b_{5i+3}, b_{5i+4}) = (0, 0, 0, 1, 0) \\ (R_3, 0), & (b_{5i}, b_{5i+1}, b_{5i+2}, b_{5i+3}, b_{5i+4}) = (0, 0, 0, 1, 1) \\ (R_2\sin(\pi/12), R_2\cos(\pi/12)), & (b_{5i}, b_{5i+1}, b_{5i+2}, b_{5i+3}, b_{5i+4}) = (0, 0, 1, 0, 0) \\ (R_1\cos(\pi/4), R_1\sin(\pi/4)), & (b_{5i}, b_{5i+1}, b_{5i+2}, b_{5i+3}, b_{5i+4}) = (0, 0, 1, 0, 1) \\ (R_3\sin(\pi/8), R_3\cos(\pi/8)), & (b_{5i}, b_{5i+1}, b_{5i+2}, b_{5i+3}, b_{5i+4}) = (0, 0, 1, 1, 0) \\ (R_3\cos(\pi/4), R_3\sin(\pi/4)), & (b_{5i}, b_{5i+1}, b_{5i+2}, b_{5i+3}, b_{5i+4}) = (0, 0, 1, 1, 1) \\ (R_2\cos(\pi/4), -R_2\sin(\pi/4)), & (b_{5i}, b_{5i+1}, b_{5i+2}, b_{5i+3}, b_{5i+4}) = (0, 1, 0, 0, 0) \\ (R_2\cos(\pi/12), -R_2\sin(\pi/12)), & (b_{5i}, b_{5i+1}, b_{5i+2}, b_{5i+3}, b_{5i+4}) = (0, 1, 0, 0, 1) \end{cases}$$

$$\begin{cases} (R_3\cos(\pi/4), -R_3\sin(\pi/4)), & (b_{5i}, b_{5i+1}, b_{5i+2}, b_{5i+3}, b_{5i+4}) = (0, 1, 0, 1, 0) \\ (R_3\cos(\pi/8), -R_3\sin(\pi/8)), & (b_{5i}, b_{5i+1}, b_{5i+2}, b_{5i+3}, b_{5i+4}) = (0, 1, 0, 1, 1) \\ (R_2\sin(\pi/12), -R_2\cos(\pi/12)), & (b_{5i}, b_{5i+1}, b_{5i+2}, b_{5i+3}, b_{5i+4}) = (0, 1, 1, 0, 0) \\ (R_1\cos(\pi/4), -R_1\sin(\pi/4)), & (b_{5i}, b_{5i+1}, b_{5i+2}, b_{5i+3}, b_{5i+4}) = (0, 1, 1, 0, 1) \\ (0, -R_3), & (b_{5i}, b_{5i+1}, b_{5i+2}, b_{5i+3}, b_{5i+4}) = (0, 1, 1, 1, 0) \\ (R_3\sin(\pi/8), -R_3\cos(\pi/8)), & (b_{5i}, b_{5i+1}, b_{5i+2}, b_{5i+3}, b_{5i+4}) = (0, 1, 1, 1, 1) \\ (-R_2\cos(\pi/4), R_2\sin(\pi/4)), & (b_{5i}, b_{5i+1}, b_{5i+2}, b_{5i+3}, b_{5i+4}) = (1, 0, 0, 0, 0) \\ (-R_2\cos(\pi/12), R_2\sin(\pi/12)), & (b_{5i}, b_{5i+1}, b_{5i+2}, b_{5i+3}, b_{5i+4}) = (1, 0, 0, 0, 1) \\ (-R_3\cos(\pi/4), R_3\sin(\pi/4)), & (b_{5i}, b_{5i+1}, b_{5i+2}, b_{5i+3}, b_{5i+4}) = (1, 0, 0, 1, 0) \\ (-R_3\cos(\pi/8), R_3\sin(\pi/8)), & (b_{5i}, b_{5i+1}, b_{5i+2}, b_{5i+3}, b_{5i+4}) = (1, 0, 0, 1, 1) \end{cases}$$

$$\begin{cases} (-R_2\sin(\pi/12), R_2\cos(\pi/12)), & (b_{5i}, b_{5i+1}, b_{5i+2}, b_{5i+3}, b_{5i+4}) = (1, 0, 1, 0, 0) \\ (-R_1\cos(\pi/4), R_1\sin(\pi/4)), & (b_{5i}, b_{5i+1}, b_{5i+2}, b_{5i+3}, b_{5i+4}) = (1, 0, 1, 0, 1) \\ (0, R_3), & (b_{5i}, b_{5i+1}, b_{5i+2}, b_{5i+3}, b_{5i+4}) = (1, 0, 1, 1, 0) \\ (-R_3\sin(\pi/8), R_3\cos(\pi/8)), & (b_{5i}, b_{5i+1}, b_{5i+2}, b_{5i+3}, b_{5i+4}) = (1, 0, 1, 1, 1) \\ (-R_2\cos(\pi/4), -R_2\sin(\pi/4)), & (b_{5i}, b_{5i+1}, b_{5i+2}, b_{5i+3}, b_{5i+4}) = (1, 1, 0, 0, 0) \\ (-R_2\cos(\pi/12), -R_2\sin(\pi/12)), & (b_{5i}, b_{5i+1}, b_{5i+2}, b_{5i+3}, b_{5i+4}) = (1, 1, 0, 0, 1) \\ (-R_3\cos(\pi/8), -R_3\sin(\pi/8)), & (b_{5i}, b_{5i+1}, b_{5i+2}, b_{5i+3}, b_{5i+4}) = (1, 1, 0, 1, 0) \\ (-R_3, 0), & (b_{5i}, b_{5i+1}, b_{5i+2}, b_{5i+3}, b_{5i+4}) = (1, 1, 0, 1, 1) \\ (-R_2\sin(\pi/12), -R_2\cos(\pi/12)), & (b_{5i}, b_{5i+1}, b_{5i+2}, b_{5i+3}, b_{5i+4}) = (1, 1, 1, 0, 0) \\ (-R_1\cos(\pi/4), -R_1\sin(\pi/4)), & (b_{5i}, b_{5i+1}, b_{5i+2}, b_{5i+3}, b_{5i+4}) = (1, 1, 1, 0, 1) \\ (-R_3\sin(\pi/8), -R_3\cos(\pi/8)), & (b_{5i}, b_{5i+1}, b_{5i+2}, b_{5i+3}, b_{5i+4}) = (1, 1, 1, 1, 0) \\ (-R_3\cos(\pi/4), -R_3\sin(\pi/4)), & (b_{5i}, b_{5i+1}, b_{5i+2}, b_{5i+3}, b_{5i+4}) = (1, 1, 1, 1, 1) \end{cases}$$

wherein $R_1$ is a radius of an inner ring, $R_2$ is a radius of an intermediate ring, and $R_3$ is a radius of an outer ring.

* * * * *